(12) United States Patent
Kamijo (10) Patent No.: US 6,642,532 B2
(45) Date of Patent: Nov. 4, 2003

(54) METHODS FOR DETERMINING A PATTERN ON A MICROLITHOGRAPHY RETICLE TO MINIMIZE PROXIMITY EFFECTS IN PATTERN ELEMENTS IN CHIPS LOCATED ON SUBSTRATE PERIPHERY

(75) Inventor: Koichi Kamijo, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/231,586

(22) Filed: Aug. 29, 2002

(65) Prior Publication Data

US 2003/0042433 A1 Mar. 6, 2003

(30) Foreign Application Priority Data

Aug. 31, 2001 (JP) ........................................ 2001-262988

(51) Int. Cl.[7] .............................. G21K 5/10; H01J 37/08
(52) U.S. Cl. .................................. 250/492.22; 430/296
(58) Field of Search ...................... 250/492.22; 430/296

(56) References Cited

U.S. PATENT DOCUMENTS

| | | |
|---|---|---|
| 6,200,710 B1 * | 3/2001 | Hada ............................. 430/5 |
| 6,501,083 B1 | 12/2002 | Kamijo |
| 6,528,806 B1 * | 3/2003 | Kawamura ............ 250/492.22 |
| 2002/0005494 A1 | 1/2002 | Kamijo et al. |
| 2002/0006563 A1 | 1/2002 | Kamijo |

OTHER PUBLICATIONS

U.S. patent application Ser. No. 09/861,210, Kamijo, filed May 17, 2001.
U.S. patent application Ser. No. 09/704,473, Kamijo, filed Nov. 1, 2000.

* cited by examiner

Primary Examiner—John R. Lee
Assistant Examiner—Erin-Michael Gill
(74) Attorney, Agent, or Firm—Klarquist Sparkman, LLP (57) ABSTRACT

Methods are disclosed for determining a reticle pattern to be defined on a reticle used for charged-particle-beam microlithography performed using a high beam-acceleration voltage. The pattern is determined so as to define pattern elements, destined for transfer-exposure to respective edges of chips, on the reticle in a manner serving to reduce proximity effects in such elements when imprinted on the substrate, whether or not the elements are in peripherally situated chips (located at or near a wafer perimeter) or in chips located centrally on the substrate. On the reticle the profile of such an element is reconfigured as required to reduce proximity effects caused by proximal pattern elements in neighboring chips. To reduce variations in the imprinted profile of such an element in peripherally located chips versus centrally located chips on the substrate, portions of neighboring chips that straddle the substrate edge are imprinted nevertheless. This ensures that the edges of each entire chip imprinted on the substrate experiences the same proximity effect that is offset by the pattern defined by the reticle, regardless of whether the imprinted entire chips are located peripherally or centrally on the substrate.

24 Claims, 5 Drawing Sheets

LITHOGRAPHY STEP

METHODS FOR DETERMINING A PATTERN ON A MICROLITHOGRAPHY RETICLE TO MINIMIZE PROXIMITY EFFECTS IN PATTERN ELEMENTS IN CHIPS LOCATED ON SUBSTRATE PERIPHERY

FIELD

This disclosure pertains to microlithography, which is a key technique used in the manufacture of microelectronic devices such as semiconductor integrated circuits, displays, and the like. More specifically, the disclosure pertains to reticles for use in microlithography performed using a charged particle beam such as an electron beam or ion beam, wherein the reticle defines a pattern to be transferred lithographically to a suitable substrate. Even more specifically, the disclosure pertains to determining the pattern to be defined on the reticle.

BACKGROUND

As the degree of integration of active circuit elements in microelectronic devices has continued to increase, with corresponding decreases in the size of individual active circuit elements in such devices, the resolution limitations of conventional optical microlithography increasingly have become apparent. Consequently, substantial effort is being expended to develop a practical "next generation" microlithography (NGL) technology. One promising candidate NGL technology is microlithography performed using a charged particle beam, which offers prospects of better resolution than optical microlithography for reasons similar to reasons for which electron microscopy yields better image resolution than optical microscopy. Charged-particle-beam (CPB) microlithography can be performed using an electron beam or ion beam. Most effort is being expended to develop a practical electron-beam microlithography apparatus.

With current CPB microlithography apparatus, it is not possible to transfer-expose an entire pattern or even a large portion thereof in a single exposure "shot" due to various factors such as the aberration and distortion exhibited by conventional CPB optical systems. For this reason, transfer-exposure using a "divided" reticle has been developed. In a divided reticle, the pattern (corresponding in area to one "chip" or "die" on the lithographic substrate) as defined on the reticle is divided, or "segmented," into a large number of exposure units, usually termed "subfields," that define respective portions of the pattern. Exposure of the pattern from the reticle occurs subfield-by-subfield, wherein the respective images of the subfields are transferred to respective locations on the substrate such that the individual subfield images are "stitched together" in a contiguous manner to form the desired chip or die on the substrate. Typically, multiple chips are formed on a single substrate. So as to be imprintable with die patterns, the upstream-facing surface of the substrate is coated with a thin film of a substance termed a "resist."

Figure 8:
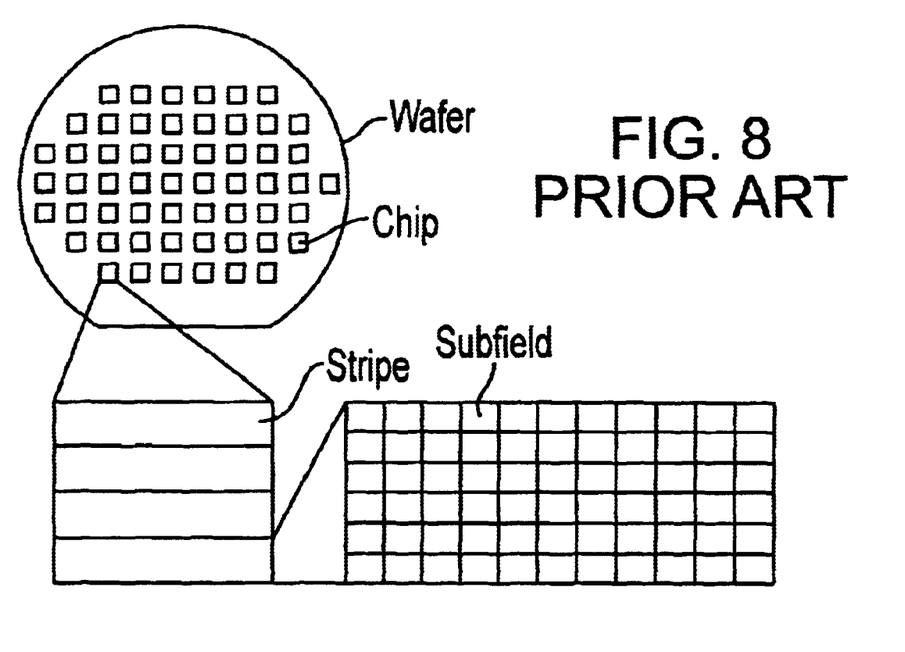
FIG. 8 is a schematic plan view showing the manner in which chips are divided into exposure units in conventional divided-reticle charged-particle-beam microlithography.

A typical manner of dividing the pattern into subfields is shown in FIG. 8. First, as noted above, multiple chips are transfer-exposed onto a "transfer body" or lithographic substrate (usually a semiconductor "wafer," which is the term used herein). The chip pattern, as transferred, is divided into one or more "stripes," and each stripe is subdivided into multiple subfields. The respective subfields in each stripe are arranged rectilinearly in multiple rows, each containing multiple respective subfields. The pattern on the reticle, and thus the reticle itself, similarly is divided into stripes and subfields.

Figure 9:
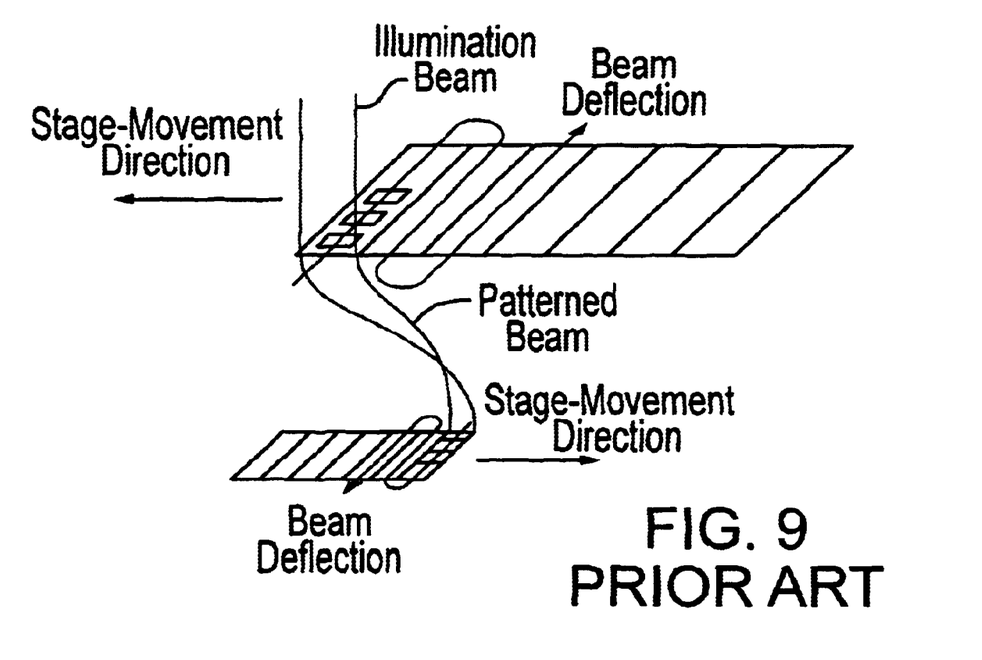
FIG. 9 is a schematic oblique view showing certain details of conventional divided-reticle transfer-exposure.

Transfer-exposure performed using a CPB microlithography apparatus and a divided reticle typically is performed in a manner as shown in FIG. 9. First, the reticle and wafer are mounted on respective stages that provide support and controlled movements of the reticle and wafer, respectively, as required for exposure. During exposure, the respective stages position the reticle and wafer such that the optical axis of the CPB optical system intersects the respective center-lines of the selected stripe on the reticle and wafer. Exposure of a stripe is achieved by appropriate lateral deflections of the beam (performed by the CPB optical system), accompanied by respective continuous motions of the stages at respective constant velocities along the respective stripes, to expose the subfields in the selected stripe subfield-by-subfield and row-by-row.

The respective stage-movement velocities roughly correspond to the "demagnification" (reduction) ratio of the portion of the CPB optical system used to form the images on the wafer. For example, with a demagnification ratio of 1/4, each subfield image formed on the wafer is 1/4 the size of the respective subfield on the reticle; hence, during exposure the wafer stage moves at about 1/4 the velocity of the reticle stage.

For exposure, the CPB optical system includes an "illumination-optical system" for illuminating the subfields on the reticle and a "projection-optical system" for carrying respective aerial images of the illuminated subfields to the wafer and for resolving the images on the surface of the wafer. The charged particle beam propagating through the illumination-optical system is termed the "illumination beam," and the charged particle beam propagating through the projection-optical system is termed the "patterned beam" or "imaging beam."

Thus, during exposure of a stripe, the illumination beam is deflected laterally in a direction approximately perpendicular to the reticle-stage-movement direction to expose each row subfield-by-subfield. As exposure of a particular row ends, respective stage movements bring the next row into position for exposure, with a corresponding reverse in the deflection direction of the beam to expose the constituent subfields of the new row, and so on to the end of the stripe. Hence, exposure of the stripe progresses in a raster manner, which minimizes time lost between exposures of adjacent rows and thereby increases throughput. As exposure of a particular stripe ends, respective stage movements bring the next stripe into position for exposure.

The reticle used in the exposure method described above differs substantially in structure from a reticle used for optical microlithography. Whereas a reticle for optical lithography can be exposed in a single "shot" and is self-supporting, the reticle for CPB microlithography is structured to define individual subfields (each defining a respective portion of the pattern) and intervening structural members termed "struts." The struts extend across the reticle in a lattice manner and separate the subfields one from another. Contiguous with the struts are frame members extending around the circumference of the reticle. The struts and frame provide structural strength and rigidity for the reticle. Each subfield on the reticle includes a respective membrane portion that includes a respective patterned portion and a respective skirt. The patterned portion defines the respective portion of the pattern defined by the reticle. The skirt surrounds the patterned portion. The patterned portion is transmissive to the illumination beam such that, as the illumination beam passes through the patterned portion, the beam acquires an aerial image of the respective pattern elements defined in the patterned portion. The outer edges of the illumination beam fall within the skirt as each subfield is illuminated. The skirt and the struts surrounding the skirt effectively isolate each subfield for individual exposure without crosstalk between adjacent subfields during exposure.

CPB microlithography is subject to a phenomenon known as the space-charge effect (also termed a "Coulomb effect") caused by mutual electrostatic repulsion of charged particles in the beam. The mutual repulsion causes widening of the beam, with an accompanying drop in pattern-transfer resolution. To reduce the space-charge effect, the beam-acceleration voltage may be increased to increase the velocity of particles in the beam and correspondingly reduce the particle—particle interaction time during propagation from the reticle to the wafer. Hence, increasing the beam-acceleration voltage conventionally is a favored means for increasing pattern-transfer resolution.

However, increasing the beam-acceleration voltage causes certain problems, notably undesired changes in the profiles of pattern elements as transfer-exposed onto the wafer, especially in peripheral regions of the chip. For example, a higher beam-acceleration voltage can cause undesired increases in pattern linewidth, relative to design-specified values, especially in peripheral regions of the chip, compared to similar exposures using a lower beam-acceleration voltage. As a result, pattern resolution of the overall chip is degraded.

SUMMARY

In view of the shortcomings of conventional methods as summarized above, the present invention provides, inter alia, improved methods for configuring a pattern on a reticle. The methods result in pattern portions destined to be located on or near peripheral regions of chips being transferred with greater fidelity to design-mandated values, even when transfer-exposed using a charged-particle-beam (CPB) microlithography ("exposure") apparatus utilizing a high beam-acceleration voltage.

According to a first aspect of the invention, methods are provided for configuring a reticle pattern to be defined on a reticle used for charged-particle-beam microlithography. An embodiment of such a method comprises the step of identifying an element of the pattern destined for transfer-exposure to a region of a chip formed on a lithographic substrate, wherein the pattern element has an initial configuration. In another step the pattern element as defined on the reticle is reconfigured such that the profile at least partially offsets proximity effects that otherwise would be imparted to the pattern element, if the element were to be transfer-exposed in its initial configuration to the chip, by proximal elements of the pattern transfer-exposed to the same chip and by proximal elements located in an adjacent chip or chips on the substrate. The reconfigured pattern element desirably is defined in one or more subfields of the reticle. "Proximal elements" are elements located within a "proximal range", as defined herein later below, of a subject pattern element.

Another embodiment includes the element-identifying step summarized above. A determination is made of a net proximity effect that otherwise would be imparted to the pattern element, if the element were to be transfer-exposed in its initial configuration to the chip, by proximal elements of the pattern transfer-exposed to the same chip and by proximal elements located in one or more adjacent chips on the substrate. The element as defined on the reticle is reconfigured so as to offset the net proximity effect at least partially.

Yet another embodiment also includes the element-identifying step summarized above. A determination is made of a net proximity effect that otherwise would be imparted to the pattern element, if the element were to be transfer-exposed in its initial configuration to the chip, by at least one proximal element of the pattern transfer-exposed to the same chip and by at least one proximal element located in one or more adjacent chips on the substrate. A calculation is made of a profile change to be made to the pattern element, as defined on the reticle, that would offset the net proximity effect at least partially and cause the pattern element, when transfer-exposed to the substrate, to be substantially similar to a corresponding design-mandated profile for the element. The profile of the pattern element is changed according to the calculated profile change, and the pattern element is defined on the reticle according to the changed profile. This method can include the steps of determining a manner in which the pattern is to be divided, on the reticle, into subfields, and defining the pattern element in at least one subfield.

According to another aspect of the invention, methods are provided for manufacturing a divided reticle for use in charged-particle-beam microlithography. An embodiment of such a method comprises the step of dividing a pattern, to be defined on the reticle, into subfields each including a respective portion of the pattern. An identification is made of a pattern element destined for transfer-exposure to a region of a chip formed on a lithographic substrate, wherein the pattern element has an initial configuration. The pattern element is reconfigured so as to have a profile, as defined on the reticle, that at least partially offsets a net proximity effect that otherwise would be imparted to the pattern element, if the element were to be transfer-exposed in its initial configuration to the chip, by at least one proximal element of the pattern transfer-exposed to the same chip and by at least one proximal element located in one or more adjacent chips on the substrate. The reconfigured pattern element is defined in at least one subfield, and the reticle is fabricated to include the reconfigured pattern element.

In another embodiment of this method a pattern, to be defined on the reticle, is divided into subfields each including a respective portion of the pattern. A pattern element destined for transfer-exposure to a region of a chip formed on a lithographic substrate is identified. A determination is made of the net proximity effect that otherwise would be imparted to the pattern element, if the element were to be transfer-exposed in its initial configuration to the chip, by at least one proximal element of the pattern transfer-exposed to the same chip and from proximal elements located in adjacent chips on the substrate. The pattern element is reconfigured to have a profile that at least partially offsets the net proximity effect. The reconfigured pattern element is defined in at least one subfield, and the reticle is fabricated to include the reconfigured pattern element.

Yet another embodiment of this method includes the pattern-dividing step, the pattern-element-identification step, and the net-proximity-effect-determination step summarized above. A calculation is made of the reconfigured profile of the pattern element, as defined by the reticle, that would offset the net proximity effect at least partially and cause the pattern element, when transfer-exposed to the substrate, to be substantially similar to a corresponding design-mandated profile. The pattern element is reconfigured according to the calculation, the reconfigured pattern element is defined in at least one subfield, and the reticle is fabricated to include the reconfigured pattern element.

Another aspect of the invention is directed to divided reticles manufactured by any of the method summarized above.

According to another aspect of the invention, methods are provided for performing a microlithographic exposure using a charged particle beam. In an embodiment of such a method, a divided reticle is provided as summarized above, wherein the reticle defines a pattern divided among multiple subfields. A charged-particle illumination beam is directed subfield-by-subfield through the reticle, to produce a corresponding patterned beam. The patterned beam is directed to a resist-coated lithographic substrate so as to imprint the pattern in multiple chips on the substrate. The step of directing the patterned beam can comprise the step of imprinting the pattern in centrally located chips and in peripherally located chips on the substrate. In such an instance, the method can further comprise the step of reducing variations in the imprinted profile of the pattern element in the peripherally located chips versus in the centrally located chips on the substrate by transfer-exposing portions, of peripheral chips that extend partially off the substrate, of such peripheral chips still remaining on the substrate. With respect to the peripheral chips extending partially off the substrate, transfer-exposure can be made of at least one respective subfield of the portions of such peripheral chips still remaining on the substrate.

According to yet another aspect of the invention, methods are provided for manufacturing microelectronic devices, wherein the methods include a microlithographic-exposure method as summarized above.

The foregoing and additional features and advantages of the invention will be more readily apparent from the following detailed description, which proceeds with reference to the accompanying drawings.

DETAILED DESCRIPTION

The invention is described below in the context of representative embodiments that are not intended to be limiting in any way. Since the respective figures accompanying the description of the embodiments are schematic, the figures do not provide actual or relative dimensions of the depicted components.

As a result of a thorough investigation into the causes of deteriorated accuracy of projected pattern elements in peripheral regions of chips, as observed especially whenever charged-particle-beam (CPB) microlithography is performed with a high beam-acceleration voltage, it has been discovered that the actual cause is a "proximity effect" imparted by adjacent chips imprinted on the lithographic substrate ("wafer").

Normally, to perform CPB microlithography of a LSI pattern, for example, a first step involves defining the actual pattern. This step includes determining the manner in which the pattern is to be divided, on the reticle, into subfields and the manner in which individual pattern elements are to be configured in the respective subfields on the reticle. Determining how pattern elements are to be defined takes into consideration proximity effects expected to be imparted to the pattern elements when the elements are transfer-exposed onto the wafer.

A "proximity effect" is a phenomenon that is manifest on the pattern as transfer-exposed onto the wafer, wherein unwanted regions (especially adjacent to pattern elements actually exposed) of the resist become exposed. The phenomenon is caused by: (1) backscattering, into adjacent areas of resist, of charged particles of the beam by atoms and molecules of the resist and by atoms of the substrate on which the beam is incident, and (2) secondary electrons emitted by the resist on which the beam is incident. The backscattered and secondary electrons penetrate into adjacent areas of resist, causing unwanted "exposure" of the adjacent areas. Defining individual pattern elements while taking into account proximity effects involves configuring the pattern elements, to be defined on the reticle, in a manner serving to offset the proximity effect. In other words, at least certain pattern elements are defined on the reticle with respective profiles that are different from actual designed profiles so that, when the pattern elements are projected onto the wafer, the resulting respective images as formed in the resist have profiles that more closely approximate the desired as-designed profiles.

Hence, determining how pattern elements are to be defined on the reticle is performed with consideration given to a range over which respective proximity effects are significant, and to pattern elements that may be located within the range. Determining this range (termed the "proximal range") begins with a determination of the "backscattering radius"). The backscattering radius is the width of the Gaussian function corresponding to backscatter of electrons whenever the energy-intensity distribution of the incident beam is approximated by a linear combination of Gaussian functions. This radius is used to describe a distribution of energy intensity of cumulative exposure energy. The energy-intensity distribution is a function indicating the exposure energy received by surrounding points whenever an electron beam is incident at a point. The proximity effects imparted by pattern elements within the backscattering radius cannot be neglected. The proximal range (range over which proximity effects imparted by other pattern elements is significant) typically is wider than the backscattering radius, and is determined by a trade-off of accuracy versus calculation time (i.e., the greater the desired accuracy with which proximity effects are corrected, the longer the time required to calculate the proximity effects and their required corrections). Typically, by way of example, the proximal region extends more than three times the backscattering radius. The calculations result in determinations of the manner and extent to which individual pattern elements, as defined on the reticle, are to be reconfigured. Typically, these calculations are performed using a computer-simulation technique.

Information relevant to performing these calculations and determining the width of the proximal region is set forth, for example, in U.S. patent application Ser. Nos. 09/704473 and 09/861210, incorporated herein by reference.

At the relatively low beam-acceleration voltages conventionally used, backscattering radii tend to be small relative to the normal distance between adjacent (neighboring) chips on the wafer. As a result, adjacent chips on the wafer usually did not cause significant proximity effects on pattern elements projected onto peripheral regions of a chip. Hence, determining how pattern elements are to be defined on the reticle conventionally did not include a consideration of proximity effects caused by neighboring chips.

However, with increases in beam-acceleration voltage, the backscattering radius and hence the proximal range is increased correspondingly. Hence, it has been discovered that a consideration must be given, when configuring pattern elements to be defined on the reticle, to proximity effects imparted to the elements by neighboring chips when the pattern is transfer-exposed from the reticle to the wafer.

Figure 1:
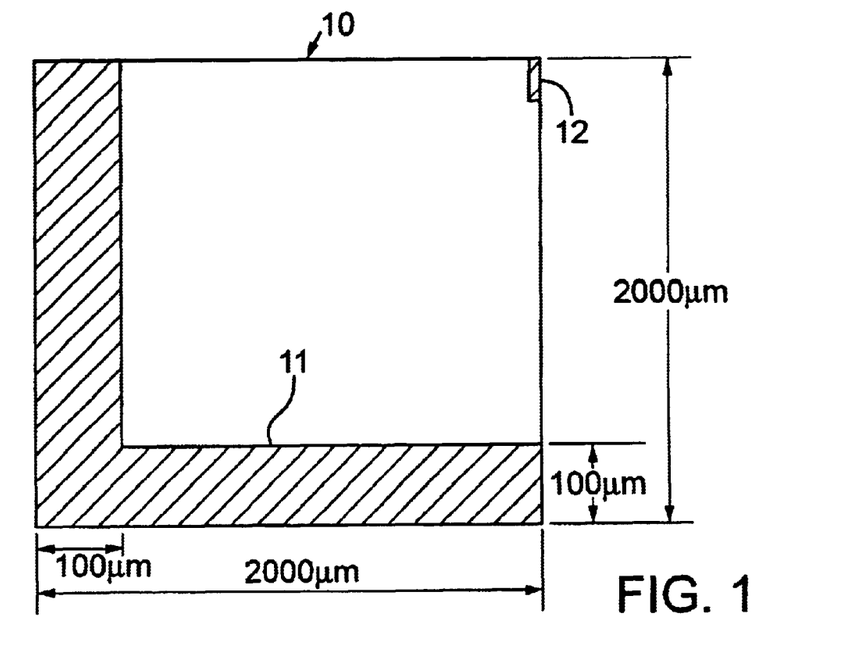
FIG. 1 is a schematic plan view of a chip pattern used in an example embodiment.
Figure 2:
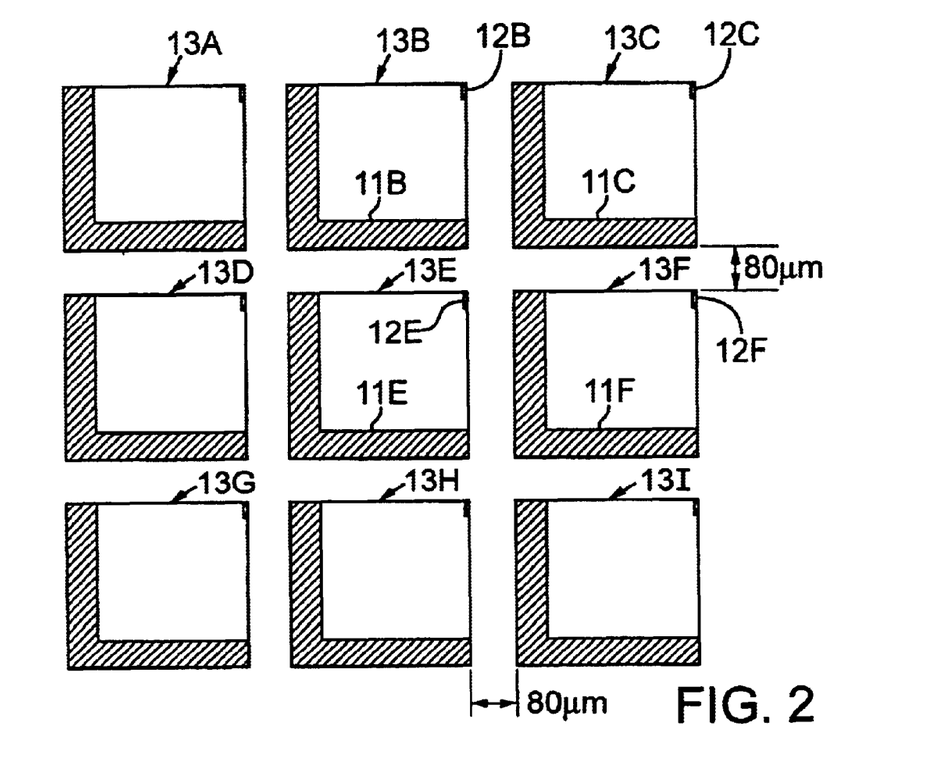
FIG. 2 is a schematic plan view of multiple chips, each configured as shown in FIG. 1, arranged as imprinted on the surface of a lithographic substrate (e.g., semiconductor wafer).

FIG. 1 schematically depicts, in plan view, an exemplary chip pattern 10 having outer dimensions of 2000 $\mu$m×2000 $\mu$m. The chip pattern 10 comprises a large L-shaped pattern element 11, having arm widths of 100 $\mu$m, extending along the left edge and bottom edge and a small line 12, having a width of 70 nm and a length of 50 $\mu$m, situated in the upper right corner opposite the L-shaped element 11. FIG. 2 shows, in plan view, an exemplary arrangement of nine individual chips 13A–13I, each having a chip pattern as shown in FIG. 1, on the surface of a wafer. The chips 13A–13I are spaced 80 $\mu$m apart in this example. Generally, the smaller the distance between chips on the wafer, the better in terms of production efficiency, because each wafer yields a correspondingly larger number of chips.

Attention is directed, in FIG. 2, to the center chip 13E that is surrounded on all sides by neighboring (adjacent) chips. With respect to the element 12E extending along the upper right edge, investigations were made of a first situation in which backscatter from neighboring chips 13B, 13C, 13F was ignored, and a second situation in which backscatter from the neighboring chips was considered. Exemplary parameters in the investigations were: a silicon substrate, a beam-acceleration voltage of 125 kV, a backscatter radius of 47.2 $\mu$m, a demagnification ratio of 1/4, and a backscatter coefficient of 0.7. In addition, the blur produced by the CPB optical system was 70 nm.

Figure 3A:
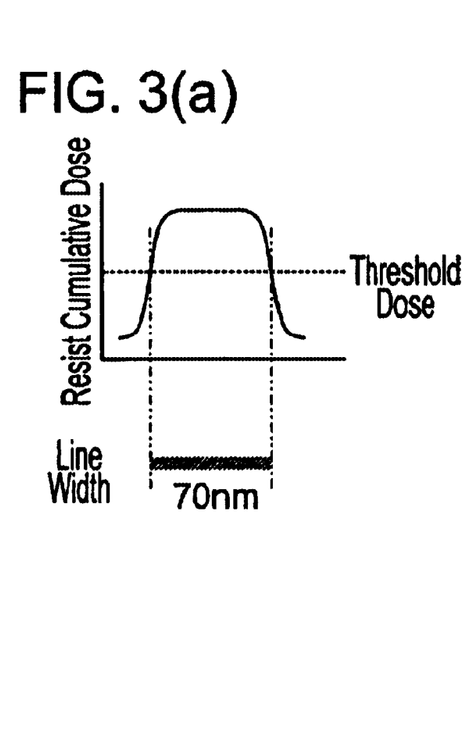
FIGS. 3(a)–3(c) are plots of cumulative exposure dose on the resist versus linewidth of a pattern element as imprinted on the substrate.

In the investigation in which backscatter from adjacent chips is ignored, a sufficient distance was assumed to exist between the large L-shaped element 11E and the small element 12E in the chip 13E. Hence, it was assumed that transfer-exposure of the small element 12E was not influenced by any proximity effect from other pattern elements or chips. Under such conditions the corresponding pattern element as defined on the reticle (for a demagnification ratio of 1/4) had a width of 280 nm. The resulting pattern element 12E as transfer-exposed onto the chip 13E (FIG. 3(a)) was defined on the reticle as having a width of 70 nm. Exposure time was established so that the threshold exposure dose for the resist was exceeded in the element 12E.

Figure 3B:
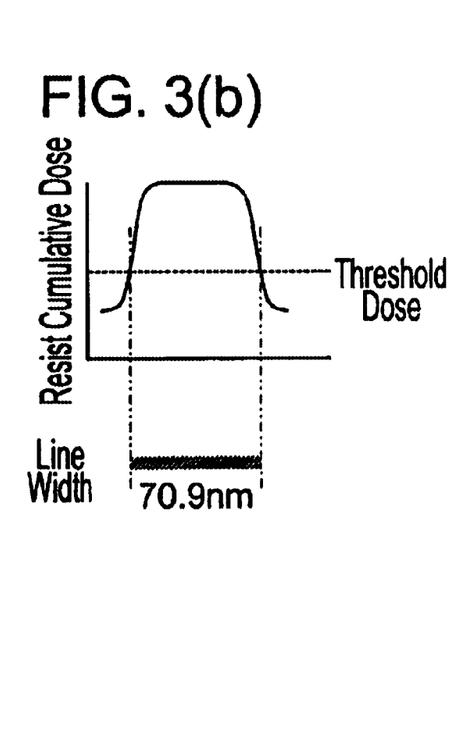
Figure 3C:
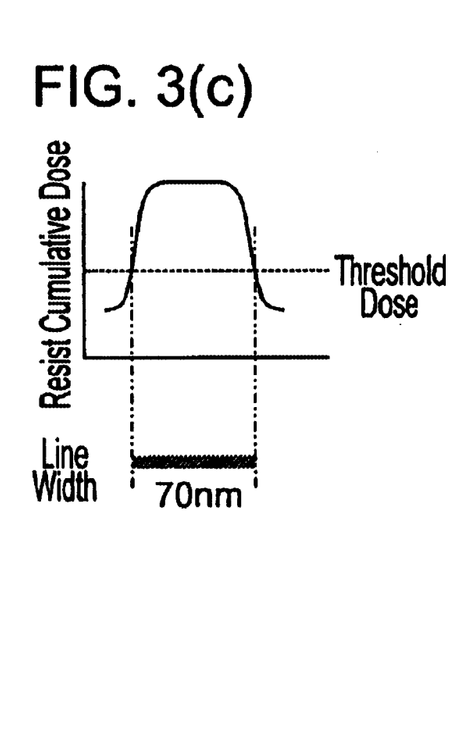

In actuality, in the chip 13E backscatter is received by the pattern element 12E from the respective large pattern elements 11B, 11C, 11F proximally located in the neighboring chips 13B, 13C, 13F, respectively. Taking this backscatter into account, the dosage received at the element 12E on the wafer is increased, as shown in FIG. 3(b). Consequently, the linewidth of the element 12E as formed on the wafer is increased by this proximity effect to 70.9 nm (FIG. 3(b)). Hence, in the investigation in which the contribution, to exposure of the pattern element 12E on the wafer, of backscatter from the large elements 11B, 11C, 11F is taken into account, calculations reveal that the width of the pattern element 12E as defined on the reticle should be changed slightly to offset this proximity effect. According to the calculations, the linewidth of the pattern element 12E as defined on the reticle is decreased to 276 nm. Exposure of this element onto the wafer yields a dosage, as received on the wafer, as shown in FIG. 3(c), in which the linewidth of the pattern element is restored to the desired width of 70 nm.

Figure 4:
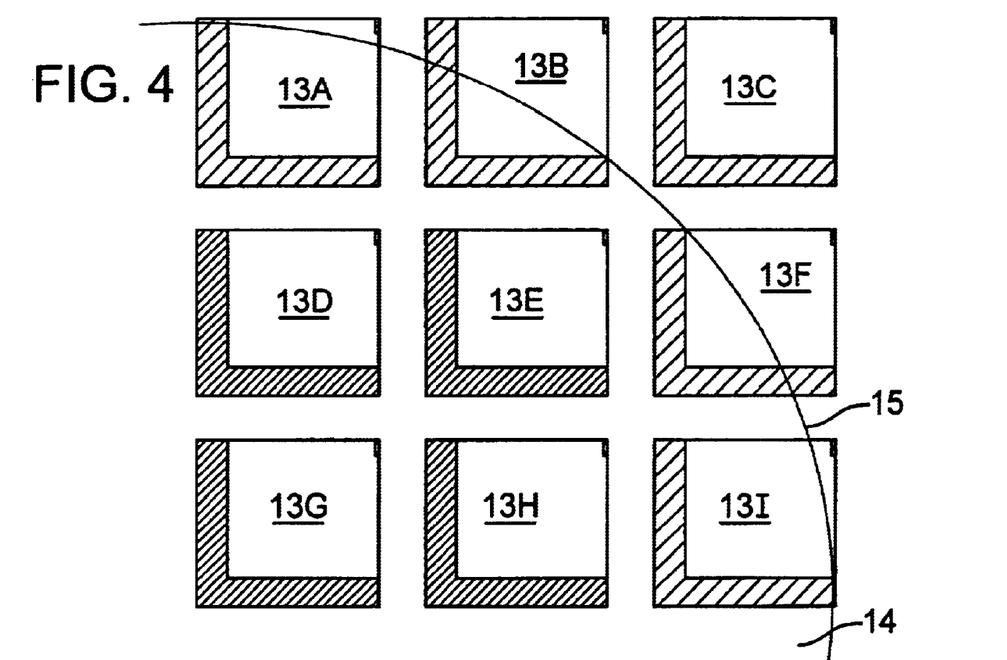
FIG. 4 is a schematic plan view of multiple chips, similar to FIG. 2 but also showing the relationship of the chips to the substrate edge.

With respect to the method described above, it is noted that a complete chip located peripherally (near an edge) of the wafer does not have a full complement of neighboring chips. As a result, whenever a pattern on the reticle is configured under the assumption in which a full set of neighboring chips exist, the reticle may not be configured optimally for exposure of certain chips (especially peripherally located chips). This situation is shown in FIG. 4, in which an edge 15 of the wafer 14 is depicted relative to the chips 13A–13I formed on the wafer. Each of the chips 13A–13I has a respective pattern such as that shown in FIG. 1. Note that the chips 13D–13E and 13G–13H can be made into finished microelectronic devices, but the chips 13A–13C, 13F and 13I cannot because each of these chips is missing at least a portion thereof (due to the chips extending partially or fully off the edge 15 of the wafer 14). The chips 13A, 13B, 13F, and 13I extending partially off the wafer edge 15 are said to be "straddling" the wafer edge.

Conventionally, it is regarded as wasteful to expose any portions of chips such as 13A, 13B, 13C, 13F, and 13I. Consequently, exposure of these chips conventionally is not performed so as not to compromise throughput. Rather, exposure conventionally is performed only of the chips 13D–13E and 13G and 13H. In FIG. 4, features that conventionally are exposed are shaded more darkly than features that are not.

However, whenever exposure of the chips 13A–13C, 13F, 13I is not performed, exposure of the chips 13D, 13E, and 13H is unaffected by backscatter from the neighboring chips 13A–13C, 13F, 13I. But, since the reticle (used to expose all the chips on the wafer) is configured to account for such backscatter, the chips 13D, 13E, 13H as transfer-exposed onto the wafer do not have optimally corrected pattern elements. To prevent this problem, exposure also is performed of portions of the chips 13A, 13B, 13F, and 13I that straddle the edge 15 of the wafer 14 but nevertheless will not become actual chips. (The chip 13C is not exposed at all because it is entirely off the wafer 14 where it cannot contribute any backscatter anyway.) By exposing the wafer in this manner, since all the chips actually formed on the wafer are affected substantially equally by backscatter by neighboring chips (or portions of chips). This allows a reticle configured to offset the resulting proximity effects to have an equally curative effect on all the chips. I.e., by exposing portions of the "partial" chips 13A, 13B, 13F, and 13I, the full chips 13D, 13E, 13H will have patterns that are as design-mandated and as fully corrected as any other chip (e.g., chip 13G) on the wafer.

Figure 5:
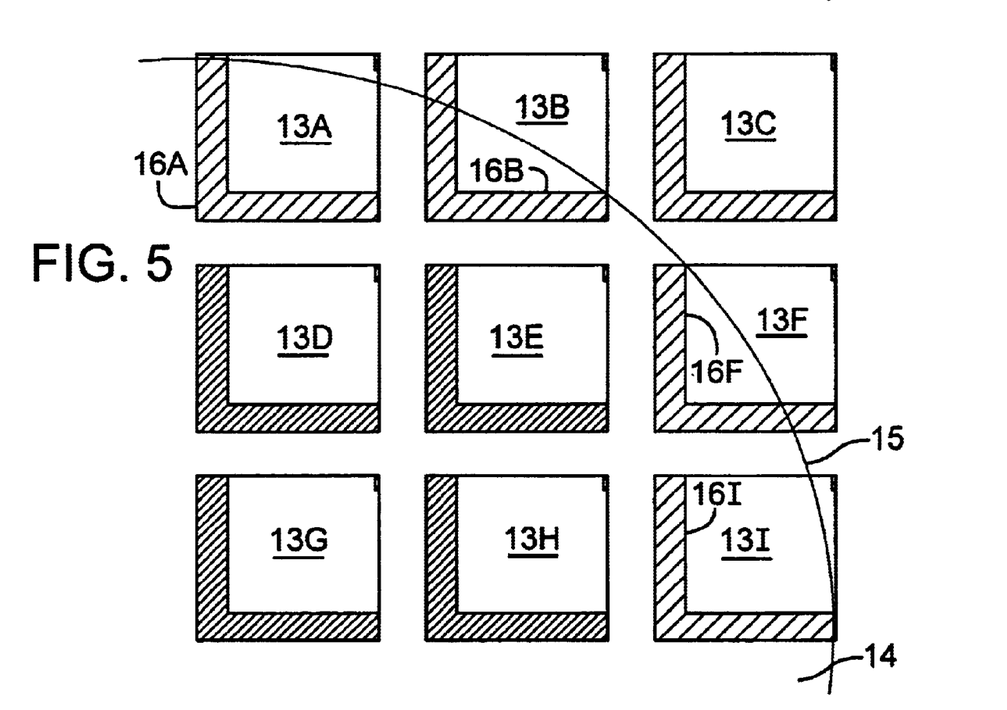
FIG. 5 is a schematic plan view, similar to FIG. 4 but showing partial exposure of chips located in peripheral regions of the substrate and that straddle the substrate edge.

Note that, with respect to the "partial" chips (i.e., chips 13A, 13B, 13F, 13I), it is unnecessary to expose all the subfields of such chips. Rather, only those subfields of such chips capable of producing backscatter that can reach proximally situated "complete" chips need be exposed. For example, as shown in FIG. 5, in the "partial" chips 13A, 13B, 13F, and 13I, only subfields situated in the respective regions denoted 16A, 16B, 1F6, and 16I, respectively, are exposed. (In FIG. 5, exposed portions are shaded more darkly than portions that are not exposed.)

Figure 6:
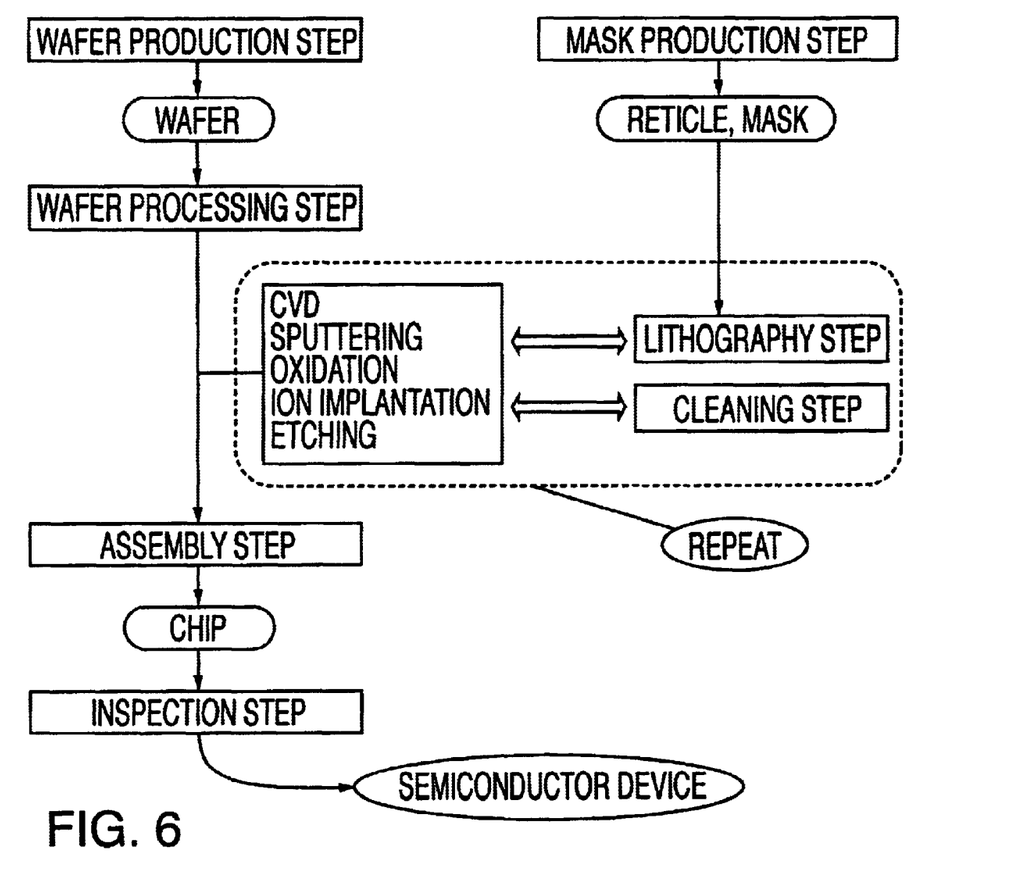
FIG. 6 is a flowchart of a representative process for fabricating microelectronic devices, wherein the process includes a microlithography method according to a representative embodiment.

FIG. 6 is a flow chart of a microelectronic-device manufacturing method that includes a microlithography step performed using a CPB-microlithography method as described herein. The depicted method generally comprises the main steps of wafer production (wafer preparation), reticle production (reticle preparation), wafer processing to form chips, chip dicing and assembly, and inspection of completed chips. Each step usually comprises several substeps.

The wafer-preparation step results in production or preparation of a wafer suitable for use as a lithographic substrate. This step typically involves growth of a monocrystalline silicon ingot, cutting of the ingot into wafers, and polishing the wafers. The reticle-preparation step results in production or preparation of a reticle that defines a desired pattern to be transferred lithographically to the wafer. This step includes performing methods as described below. The wafer-processing step comprises multiple steps resulting in the formation of multiple layers of vertically and horizontally interconnected circuit elements, and is discussed below. The chip dicing and assembly step involves cutting out (dicing) of individual chips from the wafer after completing formation of all the constituent layers of the chips on the wafer, and assembling each individual chip into a respective package with connecting leads and the like. The inspection step involves qualification and reliability testing and inspection of completed devices.

Among the main steps, wafer processing is key to achieving the smallest feature sizes (critical dimensions), best inter-layer registration, and device performance. In the wafer-processing step, multiple circuit patterns are layered successively atop one another in each die on the wafer, wherein the formation of each layer typically involves multiple sub-steps. Usually, many operative microelectronic devices (chips or dies) are produced on each wafer.

Typical wafer-processing steps include: (1) Thin-film formation involving formation of a dielectric layer for electrical insulation or a metal layer for connecting wires. The films are produced by CVD, sputtering, or other suitable technique. (2) Oxidation of the thin-film layer or other portion of the wafer surface. (3) Microlithography to form a resist pattern, according to the reticle pattern, for selective processing of the thin film or the substrate itself. (4) Etching (e.g., dry etching) or analogous step to etch the thin film or substrate according to the resist pattern. (5) Doping as required for implantation of dopant ions or impurities into the thin film or substrate according to the resist pattern. Doping can include a thermal treatment to facilitate diffusion of the impurity. (6) Resist stripping to remove the resist from the wafer. (7) Wafer inspection. Wafer processing is repeated as required (typically many times) to fabricate the desired microelectronic devices on the wafer.

Figure 7:
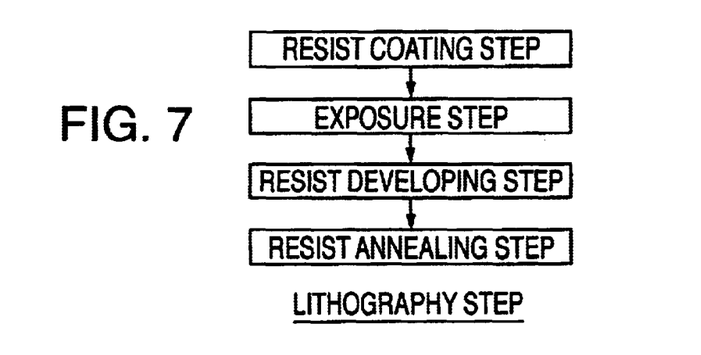
FIG. 7 is a flowchart of certain steps in the microlithography method.

FIG. 7 is a flow chart of typical steps performed in microlithography, which is a principal step in wafer processing. The microlithography step typically includes: (1) application of resist to the wafer, wherein a suitable resist is coated on the wafer substrate (which can include a circuit element formed in a previous wafer-processing step); (2) exposure step (using a CPB exposure method as described above), to expose the resist with the desired pattern and form a latent image; (3) development step, to develop the exposed resist and obtain an actual pattern in the resist; and (4) optional annealing step, to stabilize the developed pattern in the resist.

Commonly known technology can be used for any of the steps summarized above, including the microelectronic-device manufacturing process, wafer-processing, and microlithography. Hence, detailed descriptions of these processes are not provided.

Whereas the invention has been described in connection with multiple representative embodiments and examples, it will be understood that the invention is not limited to those examples. On the contrary, the invention is intended to encompass all modifications, alternatives, and equivalents as may be included within the spirit and scope of the invention, as defined by the appended claims.

What is claimed is:

1. A method for configuring a reticle pattern to be defined on a reticle used for charged-particle-beam microlithography, comprising:

identifying an element of the pattern destined for transfer-exposure to a region of a chip formed on a lithographic substrate, the pattern element having an initial configuration; and reconfiguring the pattern element as defined on the reticle such that the profile at least partially offsets proximity effects that otherwise would be imparted to the pattern element, if the element were to be transfer-exposed in its initial configuration to the chip, by proximal elements of the pattern transfer-exposed to the same chip and by proximal elements located in an adjacent chip or chips on the substrate.

2. The method of claim 1, wherein the reconfigured pattern element is defined in one or more subfields of the reticle.

3. A method for configuring a reticle pattern to be defined on a reticle used for charged-particle-beam microlithography, comprising:

identifying an element of the pattern destined for transfer-exposure to a region of a chip formed on a lithographic substrate, the pattern element having an initial configuration;

determining a net proximity effect that otherwise would be imparted to the pattern element, if the element were to be transfer-exposed in its initial configuration to the chip, by proximal elements of the pattern transfer-exposed to the same chip and by proximal elements located in one or more adjacent chips on the substrate; and reconfiguring the element as defined on the reticle so as to offset the net proximity effect at least partially.

4. The method of claim 3, wherein the reconfigured pattern element is defined in one or more subfields of the reticle.

5. A method for configuring a reticle pattern to be defined on a reticle used for charged-particle-beam microlithography, comprising:

identifying an element of the pattern destined for transfer-exposure to a region of a chip formed on a lithographic substrate, the pattern element having an initial configuration;

determining a net proximity effect that otherwise would be imparted to the pattern element, if the element were to be transfer-exposed in its initial configuration to the chip, by at least one proximal element of the pattern transfer-exposed to the same chip and by at least one proximal element located in one or more adjacent chips on the substrate;

calculating a profile change to be made to the pattern element, as defined on the reticle, that would offset the net proximity effect at least partially and cause the pattern element, when transfer-exposed to the substrate, to be substantially similar to a corresponding design-mandated profile for the element;

changing the profile of the pattern element according to the calculated profile change; and defining the pattern element on the reticle according to the changed profile.

6. The method of claim 5, further comprising the steps:

determining a manner in which the pattern is to be divided, on the reticle, into subfields; and defining the pattern element in at least one subfield.

7. A method for manufacturing a divided reticle for use in charged-particle-beam microlithography, comprising:

dividing a pattern, to be defined on the reticle, into subfields each including a respective portion of the pattern;

identifying a pattern element destined for transfer-exposure to a region of a chip formed on a lithographic substrate, the pattern element having an initial configuration;

reconfiguring the pattern element so as to have a profile, as defined on the reticle, that at least partially offsets a net proximity effect that otherwise would be imparted to the pattern element, if the element were to be transfer-exposed in its initial configuration to the chip, by at least one proximal element of the pattern transfer-exposed to the same chip and by at least one proximal element located in one or more adjacent chips on the substrate;

defining the reconfigured pattern element in at least one subfield; and fabricating the reticle to include the reconfigured pattern element.

8. A divided reticle, manufactured by the method as recited in claim 7.

9. A method for manufacturing a divided reticle for use in charged particle-beam microlithography, comprising:

dividing a pattern, to be defined on the reticle, into subfields each including a respective portion of the pattern;

identifying a pattern element destined for transfer-exposure to a region of a chip formed on a lithographic substrate, the pattern element having an initial configuration;

determining a net proximity effect that otherwise would be imparted to the pattern element, if the element were to be transfer-exposed in its initial configuration to the chip, by at least one proximal element of the pattern transfer-exposed to the same chip and from proximal elements located in adjacent chips on the substrate;

reconfiguring the pattern element to have a profile that at least partially offsets the net proximity effect;

defining the reconfigured pattern element in at least one subfield; and fabricating the reticle to include the reconfigured pattern element.

10. A divided reticle, manufactured by the method as recited in claim 9.

11. A method for manufacturing a divided reticle for use in charged-particle-beam microlithography, comprising:

dividing a pattern, to be defined on the reticle, into subfields each including a respective portion of the pattern;

identifying a pattern element destined for transfer-exposure to a region of a chip formed on a lithographic substrate, the pattern element having an initial configuration;

determining a net proximity effect that otherwise would be imparted to the pattern element, if the element were to be transfer-exposed in its initial configuration to the chip, by at least one proximal element of the pattern transfer-exposed to the same chip and by proximal elements located in adjacent chips on the substrate;

calculating a reconfigured profile of the pattern element, as defined by the reticle, that would offset the net proximity effect at least partially and cause the pattern element, when transfer-exposed to the substrate, to be substantially similar to a corresponding design-mandated profile;

reconfiguring the pattern element according to the calculation;

defining the reconfigured pattern element in at least one subfield; and fabricating the reticle to include the reconfigured pattern element.

12. A divided reticle, manufactured by the method as recited in claim 11.

13. A method for performing a microlithographic exposure using a charged particle beam, the method comprising:

(a) providing a divided reticle as recited in claim 9, the reticle defining a pattern divided among multiple subfields;

(b) directing a charged-particle illumination beam subfield-by-subfield through the reticle, to produce a corresponding patterned beam; and (c) directing the patterned beam to a resist-coated lithographic substrate so as to imprint the pattern in multiple chips on the substrate.

14. The method of claim 13, wherein step (c) comprises imprinting the pattern in centrally located chips and in peripherally located chips on the substrate, the method further comprising the step of reducing variations in the imprinted profile of the pattern element in the peripherally located chips versus in the centrally located chips on the substrate by transfer-exposing portions, of peripheral chips that extend partially off the substrate, of such peripheral chips still remaining on the substrate.

15. The method of claim 14, wherein, with respect to the peripheral chips extending partially off the substrate, at least one respective subfield of the portions of such peripheral chips still remaining on the substrate is transfer-exposed.

16. A method for performing a microlithographic exposure using a charged particle beam, the method comprising:

(a) providing a divided reticle as recited in claim 10, the reticle defining a pattern divided among multiple subfields;

(b) directing a charged-particle illumination beam subfield-by-subfield through the reticle, to produce a corresponding patterned beam; and (c) directing the patterned beam to a resist-coated lithographic substrate so as to imprint the pattern in multiple chips on the substrate.

17. The method of claim 16, wherein step (c) comprises imprinting the pattern in centrally located chips and in peripherally located chips on the substrate, the method further comprising the step of reducing variations in the imprinted profile of the pattern element in the peripherally located chips versus in the centrally located chips on the substrate by transfer-exposing portions, of peripheral chips that extend partially off the substrate, of such peripheral chips still remaining on the substrate.

18. The method of claim 17, wherein, with respect to the peripheral chips extending partially off the substrate, at least one respective subfield of the portions of such peripheral chips still remaining on the substrate is transfer-exposed.

19. A method for performing a microlithographic exposure using a charged particle beam, the method comprising:
(a) providing a divided reticle as recited in claim 12, the reticle defining a pattern divided among multiple subfields;
(b) directing a charged-particle illumination beam subfield-by-subfield through the reticle, to produce a corresponding patterned beam; and
(c) directing the patterned beam to a resist-coated lithographic substrate so as to imprint the pattern in multiple chips on the substrate.

20. The method of claim 19, wherein step (c) comprises imprinting the pattern in centrally located chips and in peripherally located chips on the substrate, the method further comprising the step of reducing variations in the imprinted profile of the pattern element in the peripherally located chips versus in the centrally located chips on the substrate by transfer-exposing portions, of peripheral chips that extend partially off the substrate, of such peripheral chips still remaining on the substrate.

21. The method of claim 20, wherein, with respect to the peripheral chips extending partially off the substrate, at least one respective subfield of the portions of such peripheral chips still remaining on the substrate is transfer-exposed.

22. A method for manufacturing a microelectronic device, comprising a microlithographic-exposure method as recited in claim 13.

23. A method for manufacturing a microelectronic device, comprising a microlithographic-exposure method as recited in claim 16.

24. A method for manufacturing a microelectronic device, comprising a microlithographic-exposure method as recited in claim 19.

* * * * *

UNITED STATES PATENT AND TRADEMARK OFFICE
CERTIFICATE OF CORRECTION

PATENT NO. : 6,642,532 B2
DATED : November 4, 2003
INVENTOR(S) : Kamijo

It is certified that error appears in the above-identified patent and that said Letters Patent is hereby corrected as shown below:

Column 6,
Lines 48-49, ""backscattering radius")." should read -- "backscattering radius" --.

Column 8,
Line 57, "manner, since all" should read -- manner, all --.

Column 9,
Line 6, "1F6" should read -- 16F --.

Signed and Sealed this

Twenty-sixth Day of April, 2005

JON W. DUDAS
*Director of the United States Patent and Trademark Office*